US009027401B2

(12) United States Patent
Onuma

(10) Patent No.: US 9,027,401 B2
(45) Date of Patent: May 12, 2015

(54) METHOD OF EVALUATING A CLAMPING PORTION OF AN ELECTRIC WIRE AND A TERMINAL, AND DEVICE FOR EVALUATING THE CLAMPING PORTION

(75) Inventor: Masanori Onuma, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 501 days.

(21) Appl. No.: 13/379,810

(22) PCT Filed: Jun. 15, 2010

(86) PCT No.: PCT/JP2010/060145
§ 371 (c)(1), (2), (4) Date: Dec. 21, 2011

(87) PCT Pub. No.: WO2010/150684
PCT Pub. Date: Dec. 29, 2010

(65) Prior Publication Data

US 2012/0146659 A1 Jun. 14, 2012

(30) Foreign Application Priority Data

Jun. 22, 2009 (JP) ................................ 2009-147734

(51) Int. Cl.
*G01R 31/02* (2006.01)
*H01R 43/048* (2006.01)

(52) U.S. Cl.
CPC .......... *H01R 43/048* (2013.01); *H01R 2201/20* (2013.01)

(58) Field of Classification Search
USPC ........... 356/601; 324/538; 73/432.1; 72/17.3, 72/20.1, 20.2
See application file for complete search history.

(56) References Cited

U.S. PATENT DOCUMENTS 4,856,186 A * 8/1989 Yeomans ........................ 29/863
5,491,994 A * 2/1996 Baldyga ......................... 72/20.1
6,626,711 B2 * 9/2003 Kitagawa et al. ............. 439/877
7,086,261 B2 * 8/2006 Saito et al. ..................... 72/17.3

(Continued)

FOREIGN PATENT DOCUMENTS

CN 1392637 A 1/2003
EP 1 447 886 A1 8/2004

(Continued)

OTHER PUBLICATIONS

International Search Report dated Aug. 10, 2010 from the International Searching Authority in counterpart application No. PCT/JP2010/060145.

(Continued)

*Primary Examiner* — Hezron E Williams
*Assistant Examiner* — Xin Zhong
(74) *Attorney, Agent, or Firm* — Sughrue Mion, PLLC

(57) ABSTRACT

There is provided a method of evaluating a clamping portion of an electric wire and a terminal, which can determine whether a clamping quality is good, or not, through simple test, and can easily test all of the clamping portions. The method of evaluating the clamping portion of an electric wire (W) and a terminal (10) includes measuring a length (L1) of the terminal (10) after clamping to detect an expansion of the terminal (10) after clamping to a length (L0) of the terminal (10) before clamping, determining that the clamping quality is "good" when the expansion falls within an allowable range between a given lower limit and a given upper limit, and determining that the clamping quality is "no good" when the expansion falls outside the allowable range.

3 Claims, 5 Drawing Sheets

(56) References Cited

U.S. PATENT DOCUMENTS

| | | | | |
|---|---|---|---|---|
| 2002/0130669 | A1 | 9/2002 | Ishibashi et al. | |
| 2004/0221634 | A1 | 11/2004 | Saito et al. | |
| 2007/0218749 | A1 * | 9/2007 | Viviroli | 439/397 |

FOREIGN PATENT DOCUMENTS

| | | | | |
|---|---|---|---|---|
| JP | 61-133844 | A | | 6/1986 |
| JP | 61133844 | A | * | 6/1986 |
| JP | 2007-109517 | A | | 4/2007 |

OTHER PUBLICATIONS

Written Opinion of the International Searching Authority dated Aug. 8, 2010 in counterpart application No. PCT/JP2010/060145.

Office Action dated Jul. 2, 2014 issued by the State Intellectual Property Office of the People's Republic of China in counterpart Chinese Patent Application No. 201080027536.2.

* cited by examiner

METHOD OF EVALUATING A CLAMPING PORTION OF AN ELECTRIC WIRE AND A TERMINAL, AND DEVICE FOR EVALUATING THE CLAMPING PORTION

CROSS REFERENCE TO RELATED APPLICATION

This application is a National Stage of International Application No. PCT/JP2010/060145 filed Jun. 15, 2010, claiming the benefit of Application No. JP 2009-147734 filed Jun. 22, 2009, in the Japanese Patent Office (JPO), the contents of all of which are incorporated herein in their entirety.

TECHNICAL FIELD

The present invention relates to an evaluation method and an evaluation device for a clamping portion of an electric wire and a terminal.

BACKGROUND ART

FIG. 4 illustrates a general configuration example of a clamping terminal. As illustrated in FIG. 4(*a*), a wire barrel (that is, swaging portion) 11 and an insulation barrel (that is, coated swaging portion) 12, which are U-shaped in cross section are disposed on a rear portion of a terminal 10. When the terminal 10 is connected to an electric wire W, a conductor Wa exposed by stripping an insulating coating Wb of a terminal portion of the electric wire W is inserted into the wire barrel 11, and a portion adjacent to the conductor Wa and formed with the insulating coating Wb is inserted into the insulation barrel 12. Then, in that state, as illustrated in FIG. 5, the wire barrel 11 is rounded inwardly and swaged by a crimper 101 and an anvil 102 of a terminal clamping device whereby the wire barrel 11 of the terminal 10 is crimped onto the conductor Wa of the electric wire W. The insulation barrel 12 is bent inwardly to swap and fix the insulation barrel 12 of the terminal 10 onto the portion of the electric wire W with the insulating coating Wb (refer to FIG. 4(*b*)). As a result, the terminal 10 and the electric wire W are connected.

There has been known that the above connection is liable to cause a difference in electric connection performance and mechanical connection performance due to the clamping quality of the conductor Wa and the wire barrel 11. Under the circumstances, there has been known a terminal clamping failure detecting device for detecting the failure during a process of clamping the terminal to discriminate a clamping state (for example, refer to Patent Document 1). In the terminal clamping failure detecting device, a pressure exerted on the crimper and the anvil during the clamping process is detected by a pressure sensor, and a pressure waveform detected by the pressure sensor is compared with a reference waveform during a normal state to determine whether the clamping is appropriately conducted, or not.

Also, as another evaluation method for the clamping portion, as illustrated in FIG. 6, a crimp height C/H and a crimp wide C/W of the conductor clamping portion due to the wire barrel 11 are measured by a dedicated micrometer, and whether the clamping quality is good, or not, is determined, for example, according to whether the crimp height C/H falls within an allowable range, or not.

CITATION LIST

Patent Document

Patent Literature 1: JP-A-2007-109517

SUMMARY OF INVENTION

Technical Problem

However, in the former device disclosed in Patent Literature 1, because the pressure sensor must be incorporated into the terminal clamping device in advance, the configuration becomes complicated, and the costs are increased. Also, since a product after clamping is not directly tested, there arises such a problem that a final evaluation is difficult.

Also, in the latter method of measuring the crimp height, since there is a need to manually conduct the test by a dedicated micrometer, the work is troublesome, and the labor hour is taken, there arises such a problem that there is a difficulty to test all of clamping portions.

In view of the above circumstances, the present invention aims a method of evaluating a clamping portion of an electric wire and a terminal, and a device of evaluating the clamping portion, which can determine whether a clamping quality is good, or not, through simple test, and can easily test all of the clamping portions.

Solution To Problem

In order to solve the above problem, according to a first aspect of the present invention, there is provided a method of evaluating a clamping portion of an electric wire and a terminal, comprising: measuring a length of the terminal after clamping to detect an expansion of the terminal after clamping to the length of the terminal before clamping; determining that the clamping quality is “good” when the expansion falls within an allowable range between a given lower limit and a given upper limit; and determining that the clamping quality is “no good” when the expansion falls outside the allowable range.

According to a second aspect of the present invention, there is provided a device of evaluating a clamping portion of an electric wire and a terminal, comprising: a stand that sets up the terminal with reference to one end of the terminal in a longitudinal direction thereof; and a detection unit that detects whether a position of the other end of the terminal which is set up on the stand in the longitudinal direction falls within an allowable range defined on the basis of a given lower limit and a given upper limit of expansion of the terminal after clamping, or not.

According to a third aspect of the present invention, there is provided a device of evaluating a clamping portion of an electric wire and a terminal, comprising: a detection unit that detects an expansion of the terminal after clamping in a longitudinal direction thereof to the terminal before clamping; and a determination unit that determines that the clamping quality is “good” when the expansion detected by the detection unit falls within an allowable range between a given lower limit and a given upper limit, and the clamping quality is “no good” when the expansion falls outside the allowable range.

Advantageous Effects of Invention

According to the first aspect of the present invention, with the use of a correlation between a crimp height and the expansion of the terminal due to clamping, the lower limit and the upper limit of the expansion of the terminal are set instead of the lower limit and the upper limit of the crimp height. It is determined whether the quality of the clamping portion is good, or not, according to whether the expansion of the terminal measured after clamping falls within the allowable range between the lower limit and the upper limit, or not, and therefore the clamping portion can be easily evaluated. That is, because measuring the length of the terminal is easier than measuring the crimp height, automation can be easily realized whereby all of the clamping portions can be tested. As a result, all performances of the clamping products can be ensured.

According to the second aspect of the present invention, the terminal is set up on the stand, and it is detected where a tip of the terminal is positioned whereby the quality of the clamping portion can be easily evaluated.

According to the third aspect of the present invention, the expansion of the terminal is detected by the detection unit, and how long is the expansion is determined by the determination unit whereby the quality of the clamping portion can be easily evaluated.

DESCRIPTION OF EMBODIMENTS

Hereinafter, embodiments of the present invention will be described with reference to the drawings.

Figure 1:
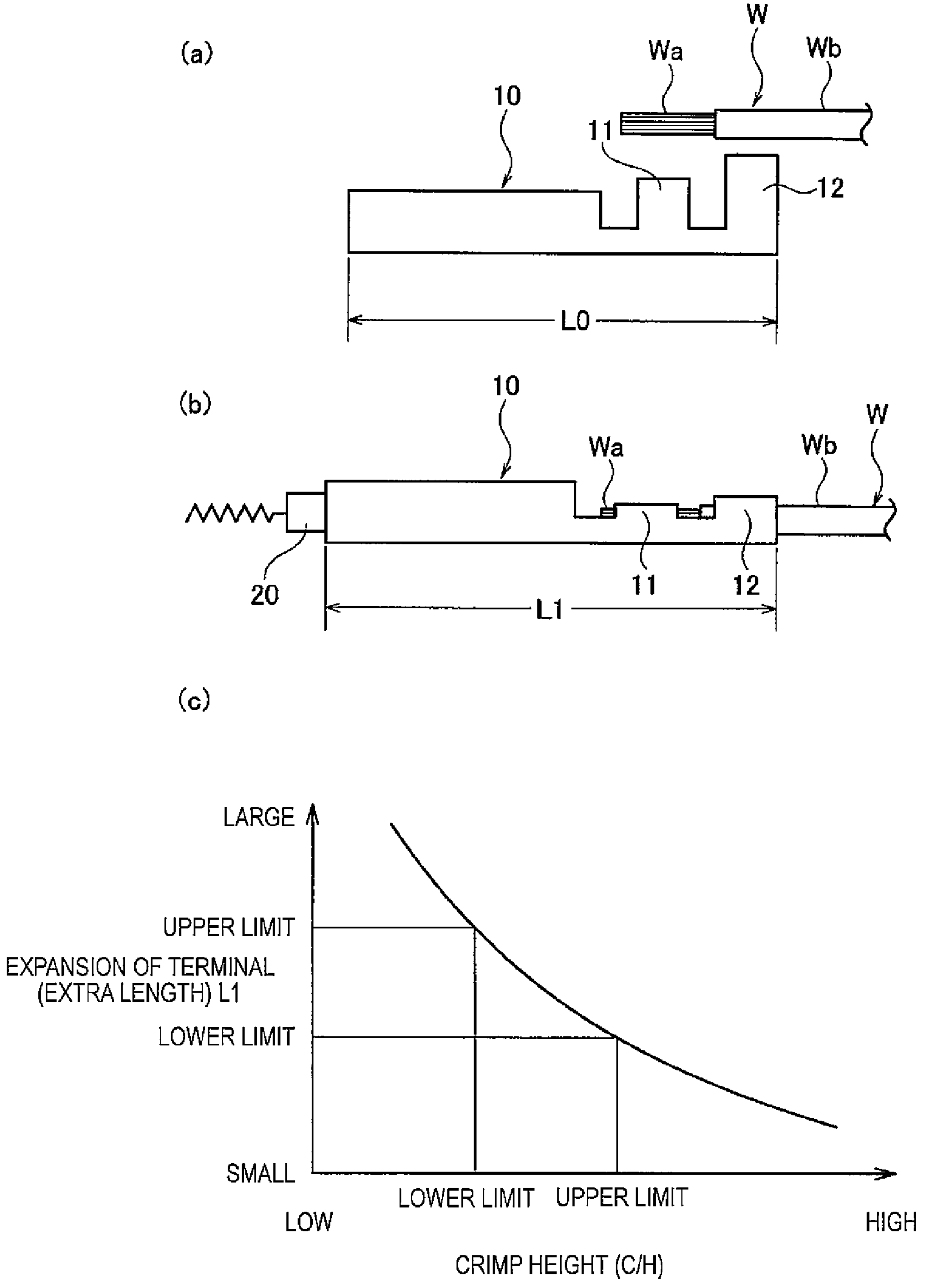
FIG. 1 is an illustrative diagram of an evaluation method according to an embodiment of the present invention, in which FIG. 1(*a*) is a side view illustrating a state before a terminal and an electric wire are crimped onto each other, FIG. 1(*b*) is a side view illustrating a state after the terminal and the electric wire are crimped onto each other, and FIG. 1(*c*) is a characteristic diagram illustrating a relationship between a crimp height and the expansion of the terminal due to clamping.
Figure 4:
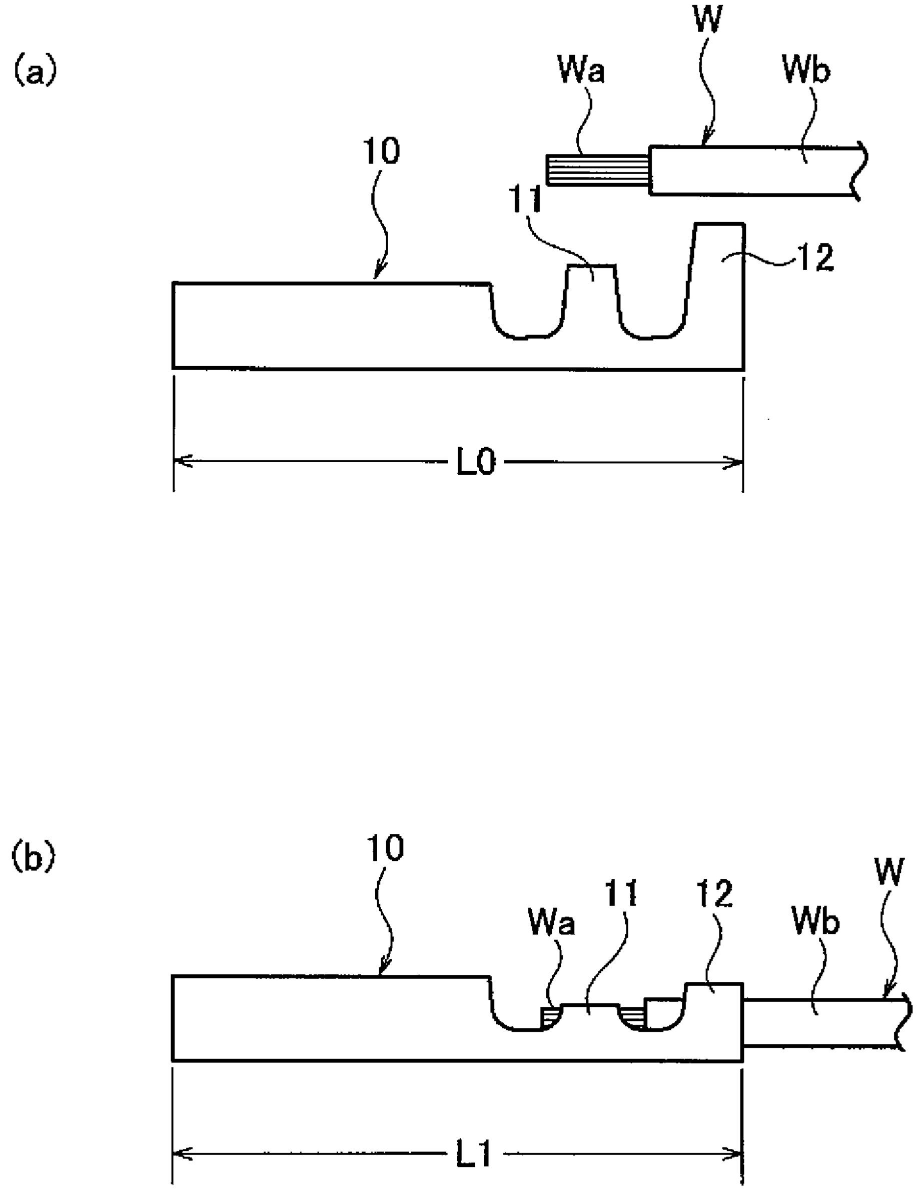
FIG. 4 is a configuration diagram of a general clamping terminal, in which FIG. 4(*a*) is a side view illustrating a state before a terminal and an electric wire are crimped onto each other, and FIG. 4(*b*) is a side view illustrating a state after the terminal and the electric wire are crimped onto each other.
Figure 5:
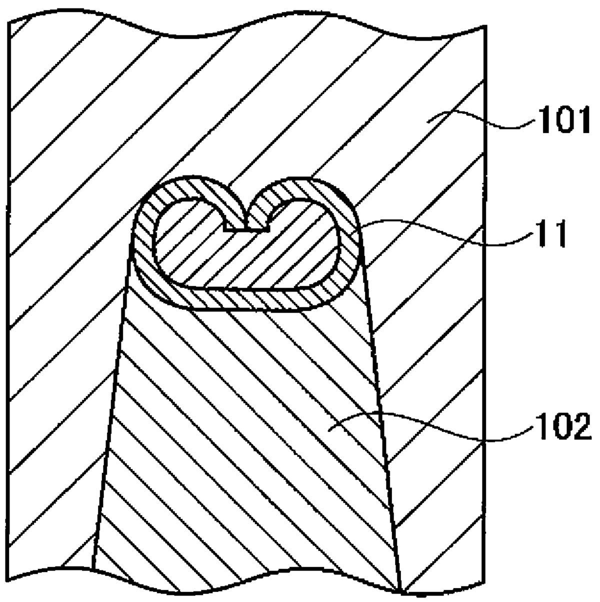
FIG. 5 is a cross-sectional view illustrating a state in which the terminal and the electric wire are crimped onto each other by a crimper and an anvil.
Figure 6:
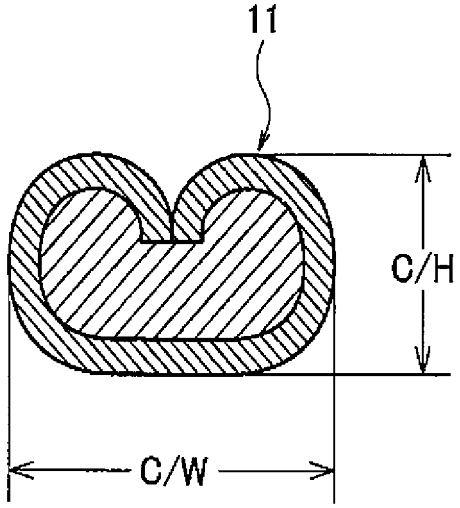
FIG. 6 is a cross-sectional view of a clamping portion of the terminal and the electric wire.

FIG. 1 is an illustrative diagram of an evaluation method according to an embodiment of the present invention, in which FIG. 1(*a*) is a side view illustrating a state before a terminal and an electric wire are crimped onto each other, FIG. 1(*b*) is a side view illustrating a state after the terminal and the electric wire are crimped onto each other, and FIG. 1(*c*) is a characteristic diagram illustrating a relationship between a crimp height and the expansion of the terminal due to clamping. The configuration of a terminal 10 and the configuration of an electric wire W are identical with those in FIG. 4, and therefore, their description will be omitted.

In this embodiment, as illustrated in FIGS. 1(*a*) and 1(*b*), an overall length L0 of the terminal 10 before clamping are grasped in advance, and an overall length L1 of the terminal 10 after clamping is measured by a detection unit 20 such as a sensor or a switch. The overall length L0 of the terminal 10 before clamping is subtracted from the overall length L1 of the terminal 10 after clamping to detect the expansion of the terminal 10 after clamping to the length of the terminal 10 before clamping.

There is known that there is a correlation (that is, an inversely proportional relationship) between the expansion of the terminal 10 and a crimp height C/H due to clamping. Therefore, as illustrated in FIG. 1(*c*), an upper limit and a lower limit of the expansion of the terminal corresponding to a lower limit and an upper limit of the crimp height C/H defined in the terminal 10 are obtained in advance.

It is checked whether the measured expansion of the terminal 10 after clamping falls within the allowable range between the lower limit and the upper limit in a characteristic diagram of FIG. 1(*c*), or not. If the measured expansion falls within the allowable range, it is determined that the clamping quality is "good", and if the measured expansion falls outside the allowable range, it is determined that the clamping quality is "no good".

In this way, in the evaluation method according to this embodiment, with the use of the correlation between the crimp height C/H and the expansion of the terminal 10 due to clamping, the lower limit and the upper limit of the expansion of the terminal are set instead of the lower limit and the upper limit of the crimp height C/H. Whether the quality of the clamping portion is good, or not, is determined according to whether the expansion of the terminal 10 measured after clamping falls within the allowable range between the lower limit and the upper limit. Therefore, the clamping portion can be easily evaluated. That is, because measuring the length of the terminal 10 is easier than measuring the crimp height C/H, automation can be easily realized, thereby enabling all of the clamping portions to be tested. As a result, all performances of the clamping portions can be ensured.

Figure 2:
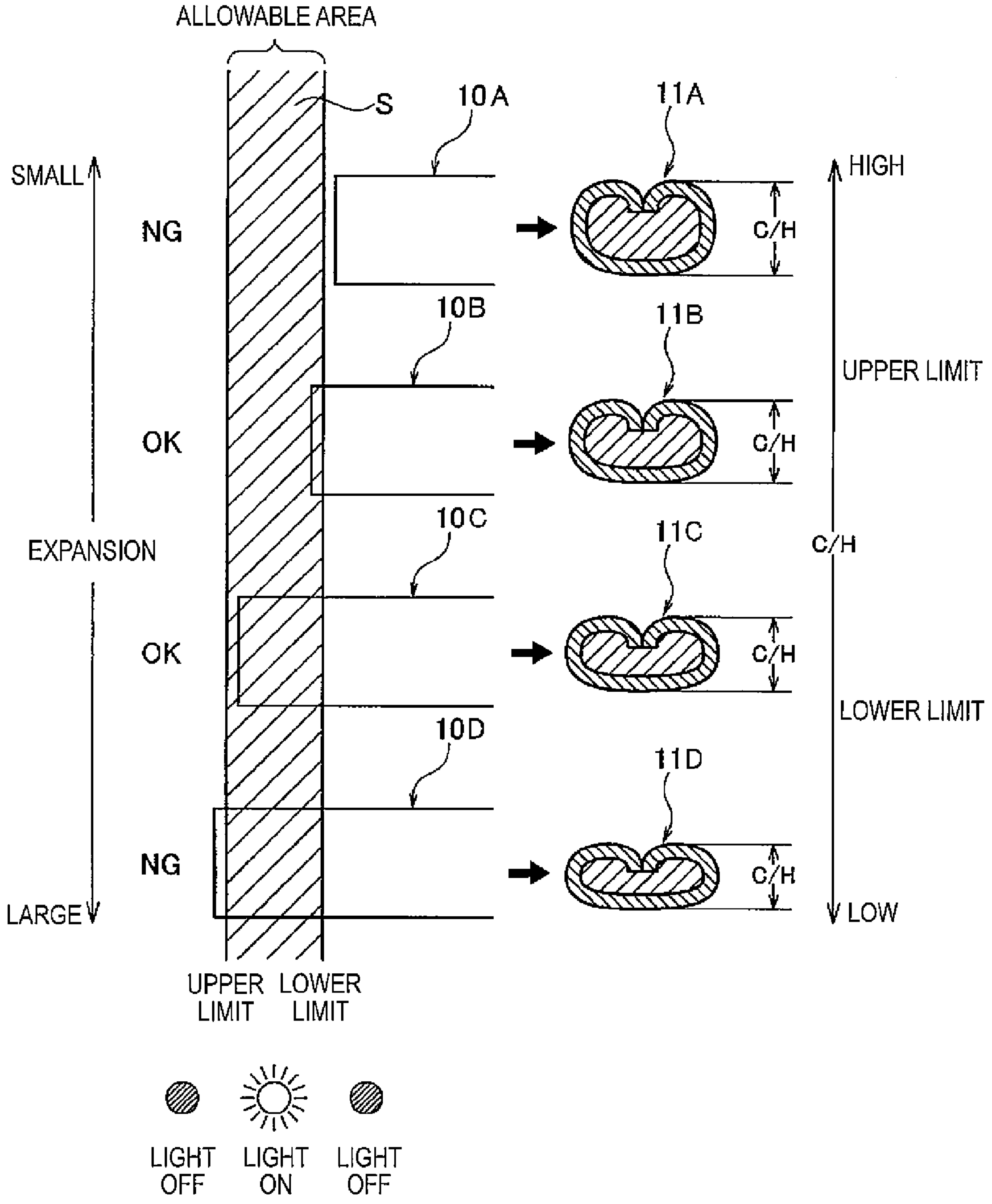
FIG. 2 is an illustrative diagram illustrating how to determine in an evaluation device according to one embodiment of the present invention, with a relationship between the expansion of the terminal and the crimp height.

A specific evaluation device for implementing this method is conceivable, for example, as illustrated in FIG. 2.

In the evaluation device of FIG. 2, the above-mentioned detection unit 20 is attached to a stand not shown. The stand can set up the terminal 10 with reference to one end (that is, a rear end connected with the electric wire) thereof in the longitudinal direction. The detection unit 20 detects whether the position of the other end (that is, a tip) of the terminal 10 in the longitudinal direction falls within an allowable area (that is, allowable range) S defined on the basis of a given lower limit and a given upper limit of the expansion of the terminal after clamping, or not.

For example, as illustrated in FIG. 2, when the tip of a terminal 10A shown on a first column is positioned short of the allowable area S, since the expansion is lower than the lower limit, the detection unit 20 does not light a display device such as a lamp with the determination as "no good (NG)". Also, when the tips of a terminal 10B shown on a second column and a terminal 10C shown on a third column are positioned within the allowable area S, since the expansion falls between the lower limit and the upper limit, the detection unit 20 lights the display device such as the lamp with the determination as "good (OK)". Also, when the tip of a terminal 10D shown on a fourth column exceeds the allowable area S, since the expansion exceeds the upper limit, the detection unit 20 does not light the display device such as the lamp with the determination as "no good (NG)". Accordingly, the quality of the clamping portion can be evaluated according to whether the lamp is lighted, or not. Those determination contents are set in advance so as to match the determination contents of the crimp height C/H. That is, since the respective crimp heights C/H of the conductor clamping portions of the wire barrel 11A shown on the first column and the wire barrel 11D shown on the fourth column exceed the upper limit and the lower limit, the determination is "no good (NG)". Since the respective crimp heights C/H of the conductor clamping portions of the wire barrels 11B and 11C shown on the second and third columns fall between the upper limit and the lower limit, the determination is "good (OK)".

Therefore, according to this device, the terminal 10 is set up on the stand, and where the tip (the other end) of the terminal 10 is positioned is detected with the result that the quality of the clamping portion can be easily evaluated.

Figure 3:
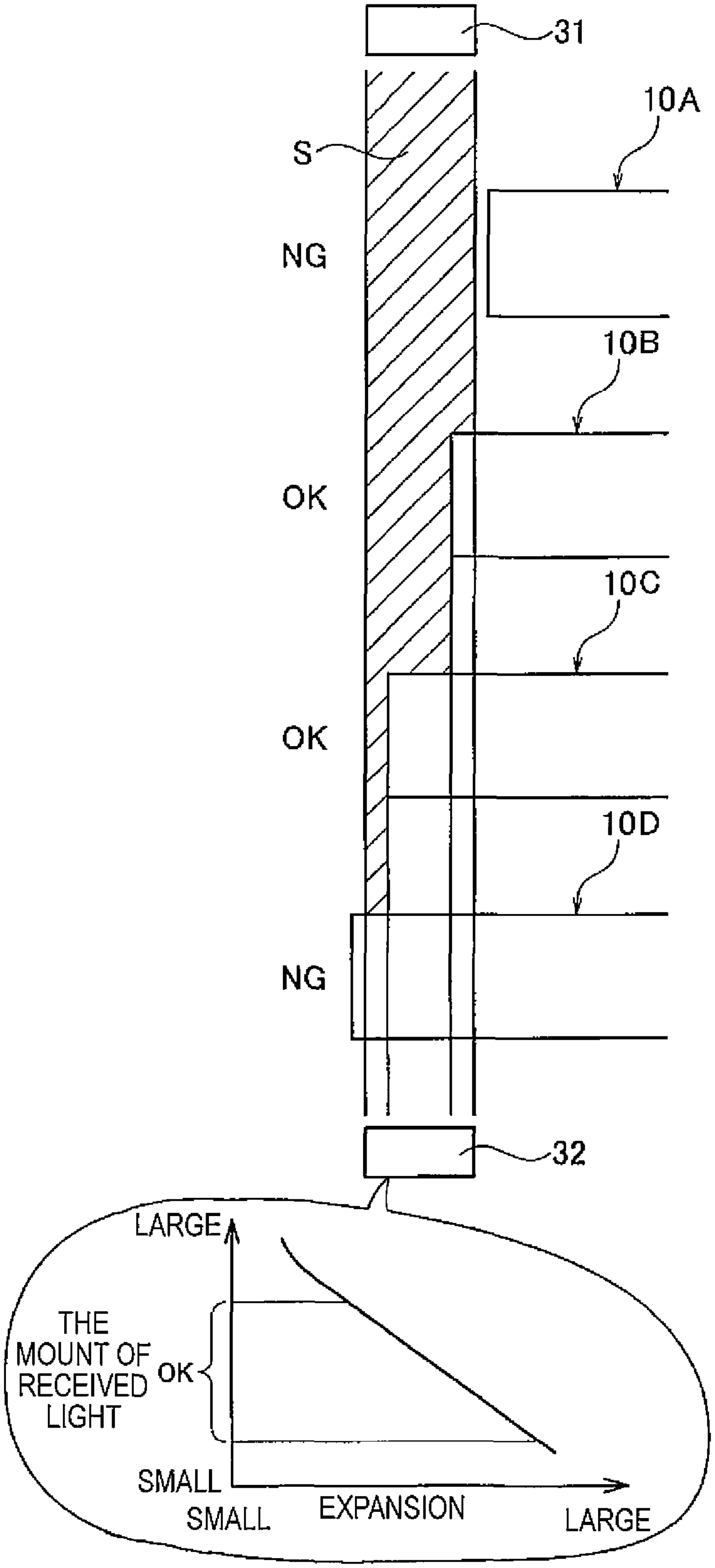
FIG. 3 is an illustrative diagram illustrating how to determine in an evaluation device according to another embodiment of the present invention.

FIG. 3 illustrates an example of an evaluation device according to another embodiment of the present invention.

In this evaluation device, as the detection unit, an optical detection mechanism having a light emitting portion 31 and a light receiving portion 32 as a set. A light emitted from the light emitting portion 31 is input to the light receiving portion 32. The lead of the terminal 10 set up on the stand enters a path of the light. For that reason, the amount of received light is reduced as large as an area in which the tip of the terminal 10 blocks the light entering the light receiving portion 32 from the light emitting portion 31. In this case, a relationship between the amount of received light and the expansion of the terminal 10 is grasped in advance, thereby being capable of setting a range of the amount of received light corresponding to an upper limit and a lower limit of the expansion of the terminal 10. The expansion of the terminal 10 can be detected by measuring the amount of received light, on the basis of which the quality of the clamping portion can be evaluated by a determination unit not shown.

In this way, the expansion of the terminal 10 is detected by the detection unit, that is, the light emitting portion 31 and the light receiving portion 32, and how long the expansion is determined by the determination unit, thereby enabling the quality of the clamping portion to be easily evaluated. That is, as illustrated in FIG. 3, because the terminal 10A shown on the first column does not block the light emitted from the light emitting portion 31, the amount of received light does not reach the amount of received light corresponding to the lower limit of the expansion of the terminal, and the determination unit determines that the clamping quality is "no good (NG)". In the terminal 10B shown on the second column and the terminal 10C shown on the third column, the amount of received light falls within the range of the amount of received light corresponding to the upper limit and the lower limit of the expansion of the terminal. Therefore, the determination unit determines that the clamping quality is "good (OK)". Since the terminal 10D shown on the fourth column blocks all of the light emitted from the light emitting portion 31, the determination unit determines that the clamping quality is "no good (NG)".

The present invention is based on Japanese Patent Application No. 2009-147734 filed on Jun. 22, 2009, and content thereof is incorporated herein by reference.

INDUSTRIAL APPLICABILITY

The method of evaluating the clamping portion of the electric wire and the terminal, and the device of evaluating the clamping portion according to the present invention are effective in the quality determination of the clamping portion when the electric wire and the terminal used as the parts for automobiles are crimped onto each other.

REFERENCE SIGNS LIST

10, terminal
11, wire barrel (terminal swaging portion)
12, insulation barrel (coated swaging portion)
W, electric wire
Wa, conductor
Wb, insulating coating
20, detection unit
31, light emitting portion (detection unit)
32, light receiving portion (detection unit)

What is claimed is:

1. A method of evaluating a clamping portion of an electric wire and a terminal, comprising:

measuring a length of the terminal after clamping to detect an expansion of the terminal compared to a length of the terminal before clamping, wherein the length of the terminal after clamping and the length of the terminal before clamping are measured along a longitudinal axis of the terminal, the longitudinal axis being parallel to a direction of extension of the electric wire;

determining that the clamping quality is "good" when the expansion falls within an allowable range between a given lower limit and a given upper limit; and determining that the clamping quality is "no good" when the expansion falls outside the allowable range.

2. A device for evaluating a clamping portion of an electric wire and a terminal, comprising:

a stand that orients the terminal so that one end of the terminal is at a first end of the stand in a longitudinal direction thereof; and a detection unit that detects whether a position of a second end of the terminal falls within an allowable range defined on the basis of a given lower limit and a given upper limit of expansion of the terminal in the longitudinal direction after clamping the terminal to the electric wire, wherein the longitudinal direction is parallel to a direction of extension of the electric wire.

3. A device for evaluating a clamping portion of an electric wire and a terminal, comprising:

a detection unit that detects an expansion of the length of the terminal after clamping compared to the length of the terminal before clamping, wherein the length of the terminal after clamping and the length of the terminal before clamping are measured along a longitudinal axis of the terminal, the longitudinal axis being parallel to a direction of extension of the electric wire; and a determination unit that determines that the clamping quality is "good" when the expansion detected by the detection unit falls within an allowable range between a given lower limit and a given upper limit, and the clamping quality is "no good" when the expansion falls outside the allowable range.

* * * * *